United States Patent
Carroll et al.

(10) Patent No.: US 8,895,843 B2
(45) Date of Patent: Nov. 25, 2014

(54) THICK-FILM PASTES CONTAINING LEAD-TELLURIUM-BORON-OXIDES, AND THEIR USE IN THE MANUFACTURE OF SEMICONDUCTOR DEVICES

(75) Inventors: Alan Frederick Carroll, Raleigh, NC (US); Kenneth Warren Hang, Hillsborough, NC (US); Brian J. Laughlin, Apex, NC (US); Kurt Richard Mikeska, Hockessin, DE (US); Carmine Torardi, Wilmington, DE (US); Paul Douglas Vernooy, Hockessin, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 13/100,550

(22) Filed: May 4, 2011

(65) Prior Publication Data
US 2011/0232746 A1 Sep. 29, 2011

Related U.S. Application Data

(60) Provisional application No. 61/331,006, filed on May 4, 2010, provisional application No. 61/440,117, filed on Feb. 7, 2011, provisional application No. 61/445,508, filed on Feb. 22, 2011, provisional application No. 61/467,003, filed on Mar. 24, 2011.

(51) Int. Cl.
| | |
|---|---|
| H01L 31/00 | (2006.01) |
| H01L 21/44 | (2006.01) |
| H01B 1/02 | (2006.01) |
| H01B 1/22 | (2006.01) |
| H01L 31/0224 | (2006.01) |
| B22F 1/00 | (2006.01) |
| B22F 7/04 | (2006.01) |
| B22F 7/08 | (2006.01) |
| C03C 8/10 | (2006.01) |
| C03C 8/12 | (2006.01) |
| C04B 35/01 | (2006.01) |
| H01B 1/16 | (2006.01) |
| H01L 31/18 | (2006.01) |
| H01L 31/0264 | (2006.01) |

(52) U.S. Cl.
CPC ...... *H01L 31/022425* (2013.01); *B22F 1/0059* (2013.01); *B22F 1/007* (2013.01); *B22F 7/04* (2013.01); *B22F 7/08* (2013.01); *C03C 8/10* (2013.01); *C03C 8/12* (2013.01); *C04B 35/01* (2013.01); *H01B 1/16* (2013.01); *H01B 1/22* (2013.01); *H01L 31/1884* (2013.01); *H01L 31/0264* (2013.01); *B22F 2007/047* (2013.01); *Y02E 10/52* (2013.01)
USPC ...... 136/256; 252/513; 257/741; 257/E23.01; 257/E21.159

(58) Field of Classification Search
USPC ........... 136/256; 438/660; 252/513; 257/741, 257/E21.159, E23.01
See application file for complete search history.

(56) References Cited

U.S. PATENT DOCUMENTS

| | | |
|---|---|---|
| 4,293,451 A | 10/1981 | Ross |
| 4,643,913 A | 2/1987 | Okunaka et al. |

(Continued)

FOREIGN PATENT DOCUMENTS

| | | |
|---|---|---|
| CN | 1060280 A | 4/1992 |
| CN | 1873836 A | 12/2006 |

(Continued)

OTHER PUBLICATIONS

EL0985 PCT International Search Report.

(Continued)

*Primary Examiner* — Jonathan Johnson
*Assistant Examiner* — Andrew Golden

(57) ABSTRACT

The present invention provides a thick-film paste for printing the front side of a solar cell device having one or more insulating layers. The thick-film paste comprises an electrically conductive metal and a lead-tellurium-boron-oxide dispersed in an organic medium.

26 Claims, 1 Drawing Sheet

(56) References Cited

U.S. PATENT DOCUMENTS

| | | | |
|---|---|---|---|
| 4,945,071 | A | 7/1990 | Friesen et al. |
| 5,013,697 | A | 5/1991 | Akhtar |
| 5,066,621 | A | 11/1991 | Akhtar |
| 5,118,362 | A | 6/1992 | St. Angelo et al. |
| 5,188,990 | A * | 2/1993 | Dumesnil et al. .......... 501/19 |
| 5,240,884 | A | 8/1993 | Herrington et al. |
| 5,336,644 | A * | 8/1994 | Akhtar et al. .......... 501/15 |
| 5,616,173 | A | 4/1997 | Okamoto et al. |
| 5,663,109 | A | 9/1997 | Dietz et al. |
| 6,204,443 | B1 | 3/2001 | Kiso et al. |
| 7,494,607 | B2 | 2/2009 | Wang et al. |
| 7,736,546 | B2 | 6/2010 | Prunchak |
| 8,313,673 | B2 | 11/2012 | Wang et al. |
| 8,383,017 | B2 | 2/2013 | Carroll et al. |
| 8,497,420 | B2 | 7/2013 | Carroll et al. |
| 2006/0102228 | A1 | 5/2006 | Sridharan et al. |
| 2006/0231800 | A1 | 10/2006 | Wang et al. |
| 2006/0231804 | A1 | 10/2006 | Wang et al. |
| 2006/0272700 | A1 | 12/2006 | Young et al. |
| 2008/0223446 | A1 * | 9/2008 | Wang et al. .......... 136/265 |
| 2009/0095344 | A1 | 4/2009 | Machida et al. |
| 2009/0189126 | A1 * | 7/2009 | Prunchak .......... 252/519.51 |
| 2009/0255584 | A1 | 10/2009 | Carroll |
| 2009/0298283 | A1 | 12/2009 | Akimoto et al. |
| 2011/0095240 | A1 | 4/2011 | Nakamura et al. |
| 2011/0192457 | A1 | 8/2011 | Nakayama et al. |

FOREIGN PATENT DOCUMENTS

| | | |
|---|---|---|
| CN | 101055896 A | 10/2007 |
| EP | 0430206 A1 | 6/1991 |
| EP | 0 463 826 A1 | 1/1992 |
| EP | 0463826 A1 | 1/1992 |
| EP | 0537886 A1 | 4/1993 |
| EP | 0393416 B1 | 6/1993 |
| JP | 59033869 A | 2/1984 |
| JP | 62-036040 | 2/1987 |
| JP | 01-138150 | 5/1989 |
| JP | 02-293344 | 4/1990 |
| JP | 03-218943 | 9/1991 |
| JP | 04-224178 | 8/1992 |
| JP | 04-270140 | 9/1992 |
| JP | 05-10548 | 4/1993 |
| JP | 5-175254 A | 7/1993 |
| JP | 08-097011 | 4/1996 |
| JP | 08-138438 | 5/1996 |
| JP | 09-092027 | 4/1997 |
| JP | 10-340621 | 12/1998 |
| JP | 2011118425 A | 4/2001 |
| JP | 2001284754 A | 10/2001 |
| JP | 2006-093433 | 4/2006 |
| JP | 2006-302890 | 11/2006 |
| JP | 2006-302891 A | 11/2006 |
| JP | 2008-520094 A | 6/2008 |
| JP | 2009-099781 A | 5/2009 |
| JP | 2010-238955 A | 10/2010 |
| JP | 2010-251645 | 11/2010 |
| JP | 2010-283340 | 12/2010 |
| KR | 10-1990-0016060 A | 11/1990 |
| KR | 10-2008-0022088 A | 3/2008 |
| WO | 92/00924 A1 | 1/1992 |
| WO | 92/00925 A1 | 1/1992 |
| WO | WO 92-00925 A1 | 1/1992 |
| WO | 2006/132766 A2 | 12/2006 |
| WO | 2008134417 A1 | 11/2008 |
| WO | 2010123967 A2 | 10/2010 |
| WO | 2012099877 A1 | 7/2012 |
| WO | 2012116052 A1 | 8/2012 |

OTHER PUBLICATIONS

EL0988CNPCT—Application No. 201180032701.8—Office Action Dated Aug. 4, 2014.
CL5006CNPCT—Application No. 201180031225.8—Office Action Dated Aug. 5, 2014.
EL0979CNPCT—Application No. 201180032359.1—Office Action Dated Aug. 19, 2014.
EL0985CNPCT—Application No. 201180031184.2—Office Action Dated Aug. 20, 2014.
International Search Report dated Aug. 3, 2012, International Application No. PCT/US2012/026085.
International Search Report dated Oct. 18, 2012, International Application No. PCT/US2012/030475.
International Search Report, US Commissioner for Patents, Alexandria, Virginia, in PCT/US2011/035167, PCT Counterpart of the Present U.S. Appl. No. 13/100,619.
International Search Report, US Commissioner for Patents, Alexandria, Virginia, in PCT/US2011/035139, PCT Counterpart of the Present U.S. Appl. No. 13/100,550.
Kurihara, Yasutoshi et al., "AG-PD Thick Film Conductor for AIN Ceramics", IEEE Transactions on Components, Hybrids, and Manufacturing Technology, vol. 13(2), 1990, 306-312.
Zhang, Y. et al., "Thermal Properties of Glass Frit and Effects on Si Solar Cells", Materials Chemist and Physics, vol. 114 (1), 2009, 319-322.
Non-Final Office Action mailed May 14, 2013, in U.S. Appl. No. 13/401,191.
Non-Final Office Action mailed Dec. 22, 2011, in U.S. Appl. No. 13/100,619.
Non-Final Office Action mailed Jul. 19, 2012, in U.S. Appl. No. 13/100,619.
Final Office Action mailed Mar. 28, 2013, in U.S. Appl. No. 13/100,619.
Non-Final Office Action mailed May 10, 2012, in U.S. Appl. No. 13/100,540.
Final Office Action mailed Mar. 14, 2013, in U.S. Appl. No. 13/100,540.
Non-Final Office Action mailed Dec. 22, 2011, in U.S. Appl. No. 13/100,550.
Non-Final Office Action mailed Sep. 6, 2012, in U.S. Appl. No. 13/100,550.
Final Office Action mailed Mar. 1, 2013, in U.S. Appl. No. 13/100,540.
Non-Final Office Action mailed May 11, 2012, in U.S. Appl. No. 13/100,563.
Final Office Action mailed Mar. 1, 2013, in U.S. Appl. No. 13/100,563.
Zhang, "Effect of interface glass on electrical performance of screen printed AG thick-film contacts of Si Solar Cells", Thin Solid Films, 518(2010) pp. e111-e113.
U.S. Appl. No. 13/100,533, filed May 4, 2011, Carroll et al.
U.S. Appl. No. 13/100,540, filed May 4, 2011, Carroll et al.
U.S. Appl. No. 13/801,036, filed Mar. 13, 2013, Carroll et al.
U.S. Appl. No. 13/100,550, filed May 4, 2011, Carroll et al.
U.S. Appl. No. 13/800,861, filed Mar. 13, 2013, Carroll et al.
U.S. Appl. No. 13/100,563, filed May 4, 2011, Carroll et al.
U.S. Appl. No. 13/801,248, filed Mar. 13, 2013, Carroll et al.
Journal of the Ceramic Association, Japan, 1968, vol. 76 (873), p. 160-172.
CL5006JPPCT (JP Patent Application No. 2013-509214)—Information Offer Form.
(U.S. Appl. No. 13/100,543, filed May 4, 2011) Non-Final Office Action Dated May 22, 2014.
CL5006EPEPT (EP Patent Aplication No. 11731163.9 )—Communication from EPO.

* cited by examiner

THICK-FILM PASTES CONTAINING LEAD-TELLURIUM-BORON-OXIDES, AND THEIR USE IN THE MANUFACTURE OF SEMICONDUCTOR DEVICES

FIELD OF THE INVENTION

The present invention provides a thick-film paste for printing the front side of a solar cell device having one or more insulating layers. The thick-film paste includes an electrically conductive metal or derivative thereof, and a lead-tellurium-boron-oxide dispersed in an organic medium.

TECHNICAL BACKGROUND

A conventional solar cell structure with a p-type base has a negative electrode that is typically on the front side (sun side) of the cell and a positive electrode on the back-side. Radiation of an appropriate wavelength falling on a p-n junction of a semiconductor body serves as a source of external energy to generate electron-hole pair charge carriers. These electron-hole pair charge carriers migrate in the electric field generated by the p-n semiconductor junction and are collected by a conductive grid or metal contact applied to the surface of the semiconductor. The current generated flows to the external circuit.

Conductive pastes (also known as inks) are typically used to form the conductive grids or metal contacts. Conductive pastes typically include a glass frit, a conductive species (e.g., silver particles), and an organic medium. To form the metal contacts, conductive pastes are printed onto a substrate as grid lines or other patterns and then fired, during which electrical contact is made between the grid lines and the semiconductor substrate.

However, crystalline silicon PV cells are typically coated with an anti-reflective coating such as silicon nitride, titanium oxide, or silicon oxide to promote light adsorption, which increases the cells' efficiency. Such anti-reflective coatings also act as an insulator, which impairs the flow of electrons from the substrate to the metal contacts. To overcome this problem, the conductive paste should penetrate the anti-reflective coating during firing to form metal contacts having electrical contact with the semiconductor substrate. Formation of a strong bond between the metal contact and the substrate (i.e., adhesion) and solderability are also desirable.

The ability to penetrate the anti-reflective coating and form a strong bond with the substrate upon firing is highly dependent on the composition of the conductive paste and firing conditions. Efficiency, a key measure of PV cell performance, is also influenced by the quality of the electrical contact made between the fired conductive paste and the substrate.

To provide an economical process for manufacturing PV cells with good efficiency, there is a need for thick-film paste compositions that can be fired at low temperatures to penetrate an anti-reflective coating and provide good electrical contact with the semiconductor substrate.

SUMMARY

One aspect of the present invention is a thick-film paste composition comprising:
a) 85 to 99.5% by weight of an electrically conductive metal or derivative thereof, based on total solids in the composition;
b) 0.5 to 15% by weight based on solids of a lead-tellurium-boron-oxide; and
c) an organic medium.

A further aspect of the present invention is a thick-film paste composition comprising:
a) 84.5 to 99% by weight of an electrically conductive metal or derivative thereof, based on total solids in the composition;
b) 0.5 to 15% by weight based on solids of a lead-tellurium-boron-oxide;
c) 0.5 to 15% by weight based on solids of a lead-tellurium-lithium-titanium-oxide; and
d) an organic medium.

Another aspect of the present invention is a process comprising:
(a) providing a semiconductor substrate comprising one or more insulating films deposited onto at least one surface of the semiconductor substrate;
(b) applying a thick-film paste composition onto the one or more insulating films to form a layered structure, wherein the thick-film paste composition includes:
  i) 85 to 99.5% by weight of an electrically conductive metal or derivative thereof, based on total solids in the composition;
  ii) 0.5 to 15% by weight based on solids of a lead-tellurium-boron-oxide; and
  iii) an organic medium; and
(c) firing the semiconductor substrate, one or more insulating films, and thick-film paste, forming an electrode in contact with the one or more insulating layers and in electrical contact with the semiconductor substrate.

Another aspect of the present invention is a process comprising:
(a) providing a semiconductor substrate comprising one or more insulating films deposited onto at least one surface of the semiconductor substrate;
(b) applying a thick-film paste composition onto the one or more insulating films to form a layered structure, wherein the thick-film paste composition includes:
  i) 84.5 to 99% by weight of an electrically conductive metal or derivative thereof, based on total solids in the composition;
  ii) 0.5 to 15% by weight based on solids of a lead-tellurium-boron-oxide;
  iii) 0.5 to 15% by weight based on solids of a lead-tellurium-lithium-titanium-oxide; and
  iv) an organic medium; and
(c) firing the semiconductor substrate, one or more insulating films, and thick-film paste, forming an electrode in contact with the one or more insulating layers and in electrical contact with the semiconductor substrate.

Another aspect of this invention is an article comprising:
a) a semiconductor substrate;
b) one or more insulating layers on the semiconductor substrate; and
c) an electrode in contact with the one or more insulating layers and
in electrical contact with the semiconductor substrate, the electrode comprising an electrically conductive metal and a lead-tellurium-boron-oxide.

Figure 1A:
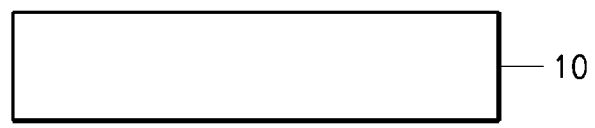
FIG. 1 is a process flow diagram illustrating the fabrication of a semiconductor device. Reference numerals shown in FIG. 1 are explained below.
10: p-type silicon substrate
20: n-type diffusion layer
30: insulating film

40: p+ layer (back surface field, BSF)
60: aluminum paste deposited on back side
61: aluminum back electrode (obtained by firing back-side aluminum paste)
70: silver or silver/aluminum paste deposited on back side
71: silver or silver/aluminum back electrode (obtained by firing back-side silver paste)
500: thick-film paste deposited on front side
501: front electrode (formed by firing the thick-film paste)

DETAILED DESCRIPTION

Solar-powered photovoltaic systems are considered to be environmentally friendly in that they reduce the need for fossil fuels.

The present invention provides compositions that can be used to manufacture photovoltaic devices with improved electrical performance. The thick-film paste composition includes:
 a) 85 to 99.5% by weight of an electrically conductive metal or derivative thereof, based on total solids in the composition;
 b) 0.5 to 15% by weight based on solids of a lead-tellurium-boron-oxide; and
 c) an organic medium.
The thick-film paste composition may further include 0.5 to 15% by weight based on solids of a lead-tellurium-lithium-titanium-oxide.

As defined herein, the organic medium is not considered to be part of the solids in the thick-film paste composition.

Electrically Conductive Metal

The electrically conductive metal is selected from the group consisting of silver, copper, and palladium. The electrically conductive metal can be in a flake form, a spherical form, a granular form, a crystalline form, a powder, or other irregular forms and mixtures thereof. The electrically conductive metal can be provided in a colloidal suspension.

When the metal is silver, it can be in the form of silver metal, silver derivatives, or mixtures thereof. Exemplary derivatives include: alloys of silver, silver oxide ($Ag_2O$), silver salts such as AgCl, $AgNO_3$, $AgOOCCH_3$ (silver acetate), $AgOOCF_3$ (silver trifluoroacetate), silver orthophosphate ($Ag_3PO_4$), for example. Other forms of silver compatible with the other thick-film paste components can also be used.

In one embodiment, the electrically conductive metal or derivatives thereof is from about 85 to about 99.5 wt % of the solid components of the thick-film paste composition. In a further embodiment, the electrically conductive metal or derivatives thereof is from about 90 to about 95 wt % of the solid components of the thick-film paste composition.

In an embodiment, the solids portion of the thick-film paste composition includes about 85 to about 99.5 wt % spherical silver particles. In one embodiment, the solids portion of the thick-film paste composition includes about 85 to about 90 wt % silver particles and about 1 to about 9.5 wt % silver flakes.

In one embodiment, the thick-film paste composition includes coated silver particles that are electrically conductive. Suitable coatings include phosphate and surfactants. Suitable surfactants include polyethyleneoxide, polyethyleneglycol, benzotriazole, poly(ethyleneglycol)acetic acid, lauric acid, oleic acid, capric acid, myristic acid, linolic acid, stearic acid, palmitic acid, stearate salts, palmitate salts, and mixtures thereof. The salt counter-ions can be ammonium, sodium, potassium, and mixtures thereof.

The particle size of the silver is not subject to any particular limitation. In one embodiment, an average particle size is 0.5-10 microns; in another embodiment, the average particle size is 1-5 microns. As used herein, "particle size" or "050" is intended to mean "average particle size"; "average particle size" means the 50% volume distribution size. Volume distribution size may be determined by LASER diffraction and dispersion method using a Microtrac particle size analyzer.

Lead-Tellurium-Boron-Oxide Compositions

An aspect of the invention relates to lead-tellurium-boron-oxide (Pb—Te—B—O) compositions. In an embodiment, these compositions may be glass compositions. In a further embodiment, these compositions may be crystalline, partially crystalline, amorphous, partially amorphous, or combinations thereof. In an embodiment, the Pb—Te—B—O composition may include more than one glass composition. In an embodiment, the Pb—Te—B—O composition may include a glass composition and an additional composition, such as a crystalline composition. The terms "glass" or "glass composition" will be used herein to represent any of the above combinations of amorphous and crystalline materials.

In an embodiment, glass compositions described herein include lead-tellurium-boron-oxide. The glass compositions may also include additional components such as silicon, silver, tin, bismuth, aluminum, titanium, copper, lithium, cerium, zirconium, sodium, vanadium, zinc, fluorine, and the like.

The lead-tellurium-boron-oxide (Pb—Te—B—O) may be prepared by mixing PbO, $TeO_2$, and $B_2O_3$ (or other materials that decompose into the desired oxides when heated) using techniques understood by one of ordinary skill in the art. Such preparation techniques may involve heating the mixture in air or an oxygen-containing atmosphere to form a melt, quenching the melt, and grinding, milling, and/or screening the quenched material to provide a powder with the desired particle size. Melting the mixture of lead, tellurium, and boron oxides is typically conducted to a peak temperature of 800 to 1200° C. The molten mixture can be quenched, for example, on a stainless steel platen or between counter-rotating stainless steel rollers to form a platelet. The resulting platelet can be milled to form a powder. Typically, the milled powder has a $D_{50}$ of 0.1 to 3.0 microns. One skilled in the art of producing glass frit may employ alternative synthesis techniques such as but not limited to water quenching, sol-gel, spray pyrolysis, quenching by splat cooling on a metal platen, or others appropriate for making powder forms of glass.

In an embodiment, the starting mixture used to make the Pb—Te—B—O may include (based on the weight of the total starting mixture): PbO that may be 25 to 75 wt %, 30 to 60 wt %, or 30 to 50 wt %; $TeO_2$ that may be 10 to 70 wt %, 25 to 60 wt %, or 40 to 60 wt %; $B_2O_3$ that may be 0.1 to 15 wt %, 0.25 to 5 wt %, or 0.4 to 2 wt %.

In an embodiment, PbO, $TeO_2$, and $B_2O_3$ may be 80-100 wt % of the Pb—Te—B—O composition. In a further embodiment, PbO, $TeO_2$, and $B_2O_3$ may be 85-100 wt % or 90-100 wt % of the Pb—Te—B—O composition.

In a further embodiment, in addition to the above PbO, $TeO_2$, and $B_2O_3$, the starting mixture used to make the Pb—Te—B—O may include one or more of $PbF_2$, $SiO_2$, $BiF_3$, $SnO_2$, $Li_2O$, $Bi_2O_3$, ZnO, $V_2O_5$, $Na_2O$, $TiO_2$, $Al_2O_3$, CuO, $ZrO_2$, $CeO_2$, or $Ag_2O$. In an embodiment, one or more of these components may be 0-20 wt %, 0-15 wt %, or 0-10 wt % of the Pb—Te—B—O composition. In aspects of this embodiment (based on the weight of the total starting mixture):

the $PbF_2$ may be 0 to 20 wt %, 0 to 15 wt %, or 5 to 10 wt %;

the $SiO_2$ may be 0 to 11 wt %, 0 to 5 wt %, 0.25 to 4 wt %, or 0 to 0.5 wt %;

the $BiF_3$ may be 0 to 15 wt %, 0 to 10 wt %, or 1 to 10 wt %;

the $SnO_2$ may be 0 to 5 wt %, 0 to 2 wt %, or 0.5 to 1.5 wt %;

the $ZnO$ may be 0 to 5 wt %, 0 to 3 wt %, or 2 to 3 wt %;

the $V_2O_5$ may be 0 to 5 wt %, 0 to 1 wt %, or 0.5 to 1 wt %;

the $Na_2O$ may be 0 to 5 wt %, 0 to 3 wt %, or 0.1 to 1.5 wt %;

the $CuO$ may be 0 to 5 wt %, 0 to 3 wt %, or 2 to 3 wt %;

the $ZrO_2$ may be 0 to 3 wt %, 0 to 2 wt %, or 0.1 to 1 wt %;

the $CeO_2$ may be 0 to 5 wt %, 0 to 3 wt %, or 0.1 to 2.5 wt %;

the $Li_2O$ may be 0 to 5 wt %, 0.1 to 3 wt %, or 0.25 to 2 wt %;

the $Bi_2O_3$ may be 0 to 15 wt %, 0 to 10 wt %, or 5 to 8 wt %;

the $TiO_2$ may be 0 to 5 wt %, 0.25 to 5 wt %, or 0.25 to 2.5 wt %;

the $Al_2O_3$ may be 0 to 3 wt %, 0 to 2 wt %, or 0.1 to 2 wt %; and the $Ag_2O$ may be 0 to 10 wt %, 1 to 10 wt %, or 1 to 8 wt %.

In an embodiment, the Pb—Te—B—O may be a homogenous powder. In a further embodiment, the Pb—Te—B—O may be a combination of more than one powder, wherein each powder may separately be a homogenous population. The composition of the overall combination of the multiple powders is within the ranges described above. For example, the Pb—Te—B—O may include a combination of two or more different powders; separately, these powders may have different compositions, and may or may not be within the ranges described above; however, the combination of these powders is within the ranges described above.

In an embodiment, the Pb—Te—B—O composition may include one powder which includes a homogenous powder including some but not all of the elements of the group Pb, Te, B, and O, and a second powder, which includes one or more of the elements of the group Pb, Te, B, and O. For example, the Pb—Te—B—O composition may include a first powder including Pb, Te, and O, and a second powder including $B_2O_3$. In an aspect of this embodiment, the powders may be melted together to form a uniform composition. In a further aspect of this embodiment, the powders may be added separately to a thick-film composition.

In an embodiment, some or all of the $Li_2O$ may be replaced with $Na_2O$, $K_2O$, $Cs_2O$, or $Rb_2O$, resulting in a glass composition with properties similar to the compositions listed above. In this embodiment, the total alkali metal oxide content may be 0 to 5 wt %, 0.1 to 3 wt %, or 0.25 to 3 wt %.

In a further embodiment, the Pb—Te—B—O composition(s) herein may include one or more of a third set of components: $GeO_2$, $Ga_2O_3$, $In_2O_3$, $NiO$, $CoO$, $ZnO$, $CaO$, $MgO$, $SrO$, $MnO$, $BaO$, $SeO_2$, $MoO_3$, $WO_3$, $Y_2O_3$, $As_2O_3$, $La_2O_3$, $Nd_2O_3$, $Bi_2O_3$, $Ta_2O_5$, $V_2O_5$, $FeO$, $HfO_2$, $Cr_2O_3$, $CdO$, $Sb_2O_3$, $PbF_2$, $ZrO_2$, $Mn_2O_3$, $P_2O_5$, $CuO$, $Pr_2O_3$, $Gd_2O_3$, $Sm_2O_3$, $Dy_2O_3$, $Eu_2O_3$, $Ho_2O_3$, $Yb_2O_3$, $Lu_2O_3$, $CeO_2$, $BiF_3$, $SnO$, $SiO_2$, $Ag_2O$, $Nb_2O_5$, $TiO_2$, $Rb_2O$, $SiO_2$, $Na_2O$, $K_2O$, $Cs_2O$, $Lu_2O_3$, $SnO_2$, and metal halides (e.g., NaCl, KBr, NaI, LiF, $ZnF_2$).

Therefore as used herein, the term "Pb—Te—B—O" may also include metal oxides that contain one or more oxides of elements selected from the group consisting of Si, Sn, Li, Ti, Ag, Na, K, Rb, Cs, Ge, Ga, In, Ni, Zn, Ca, Mg, Sr, Ba, Se, Mo, W, Y, As, La, Nd, Co, Pr, Gd, Sm, Dy, Eu, Ho, Yb, Lu, Bi, Ta, V, Fe, Hf, Cr, Cd, Sb, Bi, F, Zr, Mn, P, Cu, Ce, and Nb.

Table 1 lists some examples of powder mixtures containing $PbO$, $TeO_2$, $B_2O_3$, and other optional compounds that can be used to make lead-tellurium-boron-oxides. This list is meant to be illustrative, not limiting. In Table 1, the amounts of the compounds are shown as weight percent, based on the weight of the total glass composition.

Typically, the mixture of $PbO$ and $TeO_2$ powders includes 5 to 95 mol % of lead oxide and 5 to 95 mol % of tellurium oxide, based on the combined powders. In an embodiment the mole ratio of lead to tellurium of the lead-tellurium-boron-oxide is between 5/95 and 95/5. In one embodiment, the mixture of $PbO$ and $TeO_2$ powders includes 30 to 85 mol % of lead oxide and 15 to 70 mol % of tellurium oxide, based on the combined powders.

Glass compositions, also termed glass frits, are described herein as including percentages of certain components. Specifically, the percentages are the percentages of the components used in the starting material that was subsequently processed as described herein to form a glass composition. Such nomenclature is conventional to one of skill in the art. In other words, the composition contains certain components, and the percentages of those components are expressed as a percentage of the corresponding oxide form. As recognized by one of ordinary skill in the art in glass chemistry, a certain portion of volatile species may be released during the process of making the glass. An example of a volatile species is oxygen.

If starting with a fired glass, one of ordinary skill in the art may calculate the percentages of starting components described herein using methods known to one of skill in the art including, but not limited to: Inductively Coupled Plasma-Emission Spectroscopy (ICPES), Inductively Coupled Plasma-Atomic Emission Spectroscopy (ICP-AES), and the like. In addition, the following exemplary techniques may be used: X-Ray Fluorescence spectroscopy (XRF); Nuclear Magnetic Resonance spectroscopy (NMR); Electron Paramagnetic Resonance spectroscopy (EPR); Mossbauer spectroscopy; electron microprobe Energy Dispersive Spectroscopy (EDS); electron microprobe Wavelength Dispersive Spectroscopy (WDS); Cathodo-Luminescence (CL).

One of ordinary skill in the art would recognize that the choice of raw materials could unintentionally include impurities that may be incorporated into the glass during processing. For example, the impurities may be present in the range of hundreds to thousands ppm.

The presence of the impurities would not alter the properties of the glass, the thick-film composition, or the fired device. For example, a solar cell containing the thick-film composition may have the efficiency described herein, even if the thick-film composition includes impurities.

Lead-Tellurium-Boron-Oxide and Lead-Tellurium-Lithium-Titanium-Oxide Compositions An aspect of the invention relates to lead-tellurium-boron-oxide (Pb—Te—B—O) and lead-tellurium-lithium-titanium-oxide (Pb—Te—Li—Ti—O) compositions. In an embodiment, these compositions may be glass compositions. In a further embodiment, these compositions may be crystalline, partially crystalline, amorphous, partially amorphous, or combinations thereof. An embodiment relates to mixtures of Pb—Te—B—O and Pb—Te—Li—Ti—O compositions.

An embodiment of the invention relates to pastes including Pb—Te—B—O and Pb—Te—Li—Ti—O. It is contemplated that the pastes including Pb—Te—B—O pastes described herein may also include Pb—Te—Li—Ti—O.

In an embodiment, the Pb—Te—Li—Ti—O composition may include more than one glass composition. In an embodiment, the Pb—Te—Li—Ti—O composition may include a glass composition and an additional composition, such as a crystalline composition.

The Pb—Te—Li—Ti—O may also include oxides of additional components such as silicon, boron, silver, tin, and the like.

The lead-tellurium-lithium-titanium-oxide (Pb—Te—Li—Ti—O) may be prepared in an analogous manner to that described above for Pb—Te—B—O.

In an embodiment, the starting mixture used to make the Pb—Te—Li—Ti—O may include (based on the weight of the total starting mixture): PbO that may be 25 to 80 wt %, 30 to 60 wt %, or 30 to 50 wt %; $TeO_2$ that may be 10 to 70 wt %, 30 to 65 wt %, or 50 to 65 wt %; $Li_2O$ that may be 0.1 to 5 wt %, 0.25 to 3 wt %, or 0.5 to 2.5 wt %; $TiO_2$ that may be 0.1 to 5 wt %, 0.25 to 5 wt %, or 0.5 to 3 wt %.

In an embodiment, PbO, TeO2, Li2O, and TiO2 may be 80-100 wt %, 85-100 wt %, or 90-100 wt %, of the Pb—Te—Li—Ti—O composition.

In a further embodiment, in addition to the above PbO, $TeO_2$, $Li_2O$, and $TiO_2$, the starting mixture used to make the Pb—Te—Li—Ti—O may include one or more of $SiO_2$, $SnO_2$, $B_2O_3$, or $Ag_2O$. In an embodiment, one or more of these components may be 0-20 wt %, 0-15 wt %, or 0-10 wt % of the Pb—Te—Li—Ti—O composition. In aspects of this embodiment (based on the weight of the total starting mixture):

the $SiO_2$ may be 0 to 10 wt %, 0 to 9 wt %, or 2 to 9 wt %;

the $SnO_2$ may be 0 to 5 wt %, 0 to 4 wt %, or 0.5 to 1.5 wt %;

the $B_2O_3$ may be 0 to 10 wt %, 0 to 5 wt %, or 1 to 5 wt %; and the $Ag_2O$ may be 0 to 30 wt %, 0 to 20 wt %, or 3 to 15 wt %.

In an embodiment, the Pb—Te—Li—Ti—O may be a homogenous powder. In a further embodiment, the Pb—Te—Li—Ti—O may be a combination of more than one powder, wherein each powder may separately be a homogenous population. The composition of the overall combination of the two or more powders is within the ranges described above. For example, the Pb—Te—Li—Ti—O may include a combination of two or more different powders; separately, these powders may have different compositions, and may or may not be within the ranges described above; however, the combination of these powders is within the ranges described above.

In an embodiment, the Pb—Te—Li—Ti—O composition may include one powder which includes a homogenous powder including some but not all of the elements of the group Pb, Te, Li, Ti, and O, and a second powder, which includes one or more of the elements of the group Pb, Te, Li, Ti, and O. For example, the Pb—Te—Li—Ti—O composition may include a first powder including Pb, Te, Li, and O, and a second powder including $TiO_2$. In an aspect of this embodiment, the powders may be melted together to form a uniform composition. In a further aspect of this embodiment, the powders may be added separately to a thick-film composition.

In an embodiment, some or all of the $Li_2O$ may be replaced with $Na_2O$, $K_2O$, $Cs_2O$, or $Rb_2O$, resulting in a glass composition with properties similar to the compositions listed above. In this embodiment, the total alkali metal oxide content may be 0 to 5 wt %, 0.1 to 3 wt %, or 0.25 to 3 wt %.

In a further embodiment, the Pb—Te—Li—Ti—O composition(s) herein may include one or more of a third set of components: $GeO_2$, $Ga_2O_3$, $In_2O_3$, NiO, CoO, ZnO, CaO, MgO, SrO, MnO, BaO, $SeO_2$, $MoO_3$, $WO_3$, $Y_2O_3$, $As_2O_3$, $La_2O_3$, $Nd_2O_3$, $Bi_2O_3$, $Ta_2O_5$, $V_2O_5$, FeO, $HfO_2$, $Cr_2O_3$, CdO, $Sb_2O_3$, $PbF_2$, $ZrO_2$, $Mn_2O_3$, $P_2O_5$, CuO, $Pr_2O_3$, $Gd_2O_3$, $Sm_2O_3$, $Dy_2O_3$, $Eu_2O_3$, $Ho_2O_3$, $Yb_2O_3$, $Lu_2O_3$, $CeO_2$, $BiF_3$, SnO, $SiO_2$, $Ag_2O$, $Nb_2O_5$, $TiO_2$, $Rb_2O$, $SiO_2$, $Na_2O$, $K_2O$, $Cs_2O$, $Lu_2O_3$, $SnO_2$, and metal halides (e.g., NaCl, KBr, NaI, LiF, $ZnF_2$).

Therefore as used herein, the term "Pb—Te—Li—Ti—O" may also include one or more oxides of the elements selected from the group consisting of Si, Sn, B, Ag, Na, K, Rb, Cs, Ge, Ga, In, Ni, Co, Zn, Ca, Mg, Sr, Ba, Se, Mo, W, Y, As, La, Nd, Bi, Ta, V, Fe, Hf, Pr, Gd, Sm, Dy, Eu, Ho, Yb, Lu, Ti, Cr, Cd, Sb, Bi, F, Zr, Mn, P, Cu, Ce, and Nb.

Table 3 lists some examples of powder mixtures containing PbO, $TeO_2$, $Li_2O$, $TiO_2$, and other optional compounds that can be used to make lead-tellurium-lithium-titanium oxides. This list is meant to be illustrative, not limiting. In Table 3, the amounts of the compounds are shown as weight percent, based on the weight of the total glass composition.

In an embodiment, the mixture of PbO and $TeO_2$ powders includes 5 to 95 mol % of lead oxide and 5 to 95 mol % of tellurium oxide, based on the combined powders. In an embodiment the mole ratio of lead to tellurium of the lead-tellurium-lithium-titanium-oxide is between 5/95 and 95/5. In one embodiment, the mixture of PbO and $TeO_2$ powders include 30 to 85 mol % of lead oxide and 15 to 70 mol % of tellurium oxide, based on the combined powders.

Organic Medium

The inorganic components of the thick-film paste composition are mixed with an organic medium to form viscous pastes having suitable consistency and rheology for printing. A wide variety of inert viscous materials can be used as the organic medium. The organic medium can be one in which the inorganic components are dispersible with an adequate degree of stability during manufacturing, shipping, and storage of the pastes, as well as on the printing screen during a screen-printing process.

Suitable organic media have rheological properties that provide stable dispersion of solids, appropriate viscosity and thixotropy for screen printing, appropriate wettability of the substrate and the paste solids, a good drying rate, and good firing properties. The organic medium can contain thickeners, stabilizers, surfactants, and/or other common additives. The organic medium can be a solution of polymer(s) in solvent(s). Suitable polymers include ethyl cellulose, ethylhydroxyethyl cellulose, wood rosin, mixtures of ethyl cellulose and phenolic resins, polymethacrylates of lower alcohols, and the monobutyl ether of ethylene glycol monoacetate. Suitable solvents include terpenes such as alpha- or beta-terpineol or mixtures thereof with other solvents such as kerosene, dibutylphthalate, butyl carbitol, butyl carbitol acetate, hexylene glycol and alcohols with boiling points above 150° C., and alcohol esters. Other suitable organic medium components include: bis(2-(2-butoxyethoxy)ethyl adipate, dibasic esters such as DBE, DBE-2, DBE-3, DBE-4, DBE-5, DBE-6, DBE-9, and DBE 1B, octyl epoxy tallate, isotetradecanol, and pentaerythritol ester of hydrogenated rosin. The organic medium can also include volatile liquids to promote rapid hardening after application of the thick-film paste composition on a substrate.

The optimal amount of organic medium in the thick-film paste composition is dependent on the method of applying the paste and the specific organic medium used. Typically, the thick-film paste composition contains 70 to 95 wt % of inorganic components and 5 to 30 wt % of organic medium.

If the organic medium includes a polymer, the organic composition may include 8 to 15 wt % polymer.

Preparation of the Thick-Film Paste Composition

In one embodiment, the thick-film paste composition can be prepared by mixing the conductive metal powder, the Pb—Te—B—O powder, and the organic medium in any order. In an embodiment, the thick-film paste composition may also include Pb—Te—Li—Ti—O. In some embodiments, the inorganic materials are mixed first, and they are then added to the organic medium. The viscosity can be adjusted, if needed, by the addition of one or more solvents. Mixing methods that provide high shear may be useful.

Another aspect of the present invention is a process comprising:
(a) providing a semiconductor substrate comprising one or more insulating films deposited onto at least one surface of the semiconductor substrate;
(b) applying a thick-film paste composition onto at least a portion of the one or more insulating films to form a layered structure, wherein the thick-film paste composition includes:
  i) 85 to 99.5% by weight of an electrically conductive metal or derivative thereof, based on total solids in the composition;
  ii) 0.5 to 15% by weight based on solids of a lead-tellurium-boron-oxide; and
  iii) an organic medium; and
(c) firing the semiconductor substrate, one or more insulating films, and thick-film paste, forming an electrode in contact with the one or more insulating layers and in electrical contact with the semiconductor substrate.

A further aspect of the present invention is a process comprising:
(a) providing a semiconductor substrate comprising one or more insulating films deposited onto at least one surface of the semiconductor substrate;
(b) applying a thick-film paste composition onto at least a portion of the one or more insulating films to form a layered structure, wherein the thick-film paste composition includes:
  i) 84.5 to 99% by weight of an electrically conductive metal or derivative thereof, based on total solids in the composition;
  ii) 0.5 to 15% by weight based on solids of a lead-tellurium-boron-oxide;
  iii) 0.5 to 15% by weight based on solids of a lead-tellurium-lithium-titanium-oxide; and
  iv) an organic medium; and
(c) firing the semiconductor substrate, one or more insulating films, and thick-film paste, forming an electrode in contact with the one or more insulating layers and in electrical contact with the semiconductor substrate.

In an embodiment, the thick-film paste may include lead-tellurium-boron-oxide in an amount of 0.5 to 15%, 0.5 to 7%, or 1 to 3% by weight based on solids.

In one embodiment, a semiconductor device is manufactured from an article comprising a junction-bearing semiconductor substrate and a silicon nitride insulating film formed on a main surface thereof. The process includes the steps of applying (for example, coating or screen-printing) onto the insulating film, in a predetermined shape and thickness and at a predetermined position, the thick-film paste composition having the ability to penetrate the insulating layer, then firing so that thick-film paste composition reacts with the insulating film and penetrates the insulating film, thereby effecting electrical contact with the silicon substrate.

One embodiment of this process is illustrated in FIG. 1.

FIG. 1(a) shows a single-crystal silicon or multi-crystalline silicon p-type substrate 10.

Figure 1B:
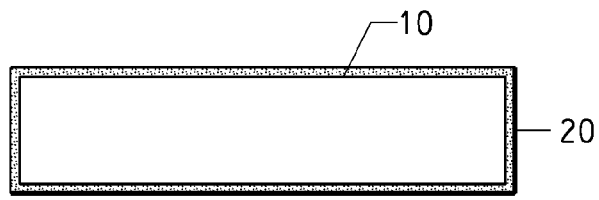

In FIG. 1(b), an n-type diffusion layer 20 of the reverse polarity is formed to create a p-n junction. The n-type diffusion layer 20 can be formed by thermal diffusion of phosphorus (P) using phosphorus oxychloride (POCl$_3$) as the phosphorus source. In the absence of any particular modifications, the n-type diffusion layer 20 is formed over the entire surface of the silicon p-type substrate. The depth of the diffusion layer can be varied by controlling the diffusion temperature and time, and is generally formed in a thickness range of about 0.3 to 0.5 microns. The n-type diffusion layer may have a sheet resistivity of several tens of ohms per square up to about 120 ohms per square.

Figure 1C:

After protecting one surface of the n-type diffusion layer 20 with a resist or the like, as shown in FIG. 1(c), the n-type diffusion layer 20 is removed from most surfaces by etching so that it remains only on one main surface. The resist is then removed using an organic solvent or the like.

Figure 1D:
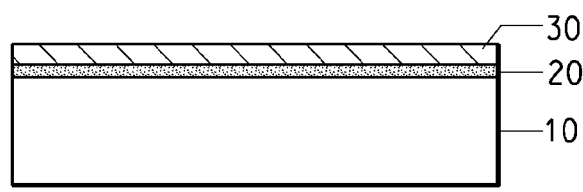

Next, in FIG. 1(d), an insulating layer 30 which also functions as an anti-reflection coating is formed on the n-type diffusion layer 20. The insulating layer is commonly silicon nitride, but can also be a SiN$_x$:H film (i.e., the insulating film includes hydrogen for passivation during subsequent firing processing), a titanium oxide film, a silicon oxide film, silicon carbon oxynitride, a silicon nitride film containing carbon, a silicon oxide film containing carbon, or a silicon oxide/titanium oxide film. A thickness of about 700 to 900 Å of a silicon nitride film is suitable for a refractive index of about 1.9 to 2.0. Deposition of the insulating layer 30 can be by sputtering, chemical vapor deposition, or other methods.

Figure 1E:
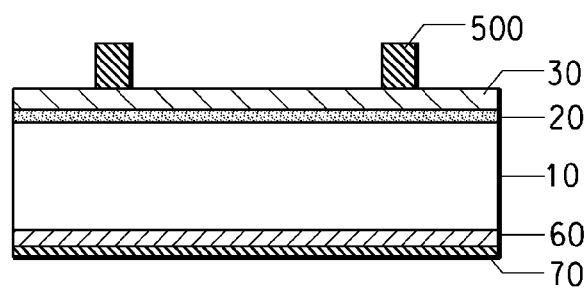

Next, electrodes are formed. As shown in FIG. 1(e), a thick-film paste composition of this invention is screen-printed on the insulating film 30, and then dried. In addition, aluminum paste 60 and back-side silver paste 70 are screen-printed onto the back side of the substrate, and successively dried. Firing is carried out at a temperature of 750 to 850° C. for a period of from several seconds to several tens of minutes.

Figure 1F:
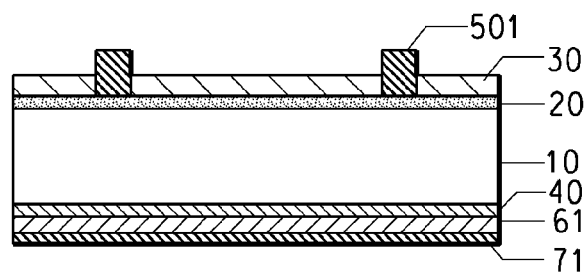

Consequently, as shown in FIG. 1(f), during firing, aluminum diffuses from the aluminum paste into the silicon substrate on the back side, thereby forming a p+ layer 40, containing a high concentration of aluminum dopant. This layer is generally called the back surface field (BSF) layer, and helps to improve the energy conversion efficiency of the solar cell. Firing converts the dried aluminum paste 60 to an aluminum back electrode 61. The back-side silver paste 70 is fired at the same time, becoming a silver or silver/aluminum back electrode 71. During firing, the boundary between the back-side aluminum and the back-side silver assumes the state of an alloy, thereby achieving electrical connection. Most areas of the back electrode are occupied by the aluminum electrode, owing in part to the need to form a p+ layer 40. At the same time, because soldering to an aluminum electrode is impossible, the silver or silver/aluminum back electrode is formed on limited areas of the back side as an electrode for interconnecting solar cells by means of copper ribbon or the like.

On the front side, the thick-film paste composition 500 of the present invention sinters and penetrates through the insulating film 30 during firing, and thereby achieves electrical contact with the n-type diffusion layer 20. This type of process is generally called "fire through." This fired-through state, i.e., the extent to which the paste melts and passes through the insulating film 30, depends on the quality and thickness of the insulating film 30, the composition of the paste, and on the firing conditions. When fired, the paste 500 becomes the electrode 501, as shown in FIG. 1(f).

In one embodiment, the insulating film is selected from titanium oxide, aluminum oxide, silicon nitride, SiN$_x$:H, silicon oxide, silicon carbon oxynitride, a silicon nitride film containing carbon, a silicon oxide film containing carbon, and silicon oxide/titanium oxide films. The silicon nitride film can be formed by sputtering, plasma-enhanced chemical vapor deposition (PECVD), or a thermal CVD process. In one embodiment, the silicon oxide film is formed by thermal oxidation, sputtering, or thermal CVD or plasma CVD. The titanium oxide film can be formed by coating a titanium-containing organic liquid material onto the semiconductor substrate and firing, or by thermal CVD.

In one embodiment of this process, the semiconductor substrate can be single-crystal or multi-crystalline silicon.

Suitable insulating films include one or more components selected from: aluminum oxide, titanium oxide, silicon nitride, $SiN_x$:H, silicon oxide, and silicon oxide/titanium oxide. In one embodiment of the invention, the insulating film is an anti-reflection coating (ARC). The insulating film can be applied to a semiconductor substrate, or it can be naturally forming, such as in the case of silicon oxide.

In one embodiment, the insulating film includes a layer of silicon nitride. The silicon nitride can be deposited by CVD (chemical vapor deposition), PECVD (plasma-enhanced chemical vapor deposition), sputtering, or other methods.

In one embodiment, the silicon nitride of the insulating layer is treated to remove at least a portion of the silicon nitride. The treatment can be a chemical treatment. The removal of at least a portion of the silicon nitride may result in an improved electrical contact between the conductor of the thick-film paste composition and the semiconductor substrate. This may result in improved efficiency of the semiconductor device.

In one embodiment, the silicon nitride of the insulating film is part of an anti-reflective coating.

The thick-film paste composition can be printed on the insulating film in a pattern, e.g., bus bars with connecting lines. The printing can be by screen-printing, plating, extrusion, inkjet, shaped or multiple printing, or ribbons.

In this electrode-forming process, the thick-film paste composition is heated to remove the organic medium and sinter the metal powder. The heating can be carried out in air or an oxygen-containing atmosphere. This step is commonly referred to as "firing." The firing temperature profile is typically set so as to enable the burnout of organic binder materials from the dried thick-film paste composition, as well as any other organic materials present. In one embodiment, the firing temperature is 750 to 950° C. The firing can be conducted in a belt furnace using high transport rates, for example, 100-500 cm/min, with resulting hold-up times of 0.05 to 5 minutes. Multiple temperature zones, for example 3 to 11 zones, can be used to control the desired thermal profile.

Upon firing, the electrically conductive metal and Pb—Te—B—O mixture penetrate the insulating film. The penetration of the insulating film results in an electrical contact between the electrode and the semiconductor substrate. After firing, an interlayer may be formed between the semiconductor substrate and the electrode, wherein the interlayer includes one or more of tellurium, tellurium compounds, lead, lead compounds, boron compounds, and silicon compounds, where the silicon may originate from the silicon substrate and/or the insulating layer(s). After firing, the electrode includes sintered metal that contacts the one or more insulating layers, and may also contact the underlying semiconductor substrate.

Another aspect of the present invention is an article formed by a process comprising:
(a) providing a semiconductor substrate comprising one or more insulating films deposited onto at least one surface of the semiconductor substrate;
(b) applying a thick-film paste composition onto at least a portion of the one or more insulating films to form a layered structure,
wherein the thick-film paste composition includes:
  i) 85 to 99.5% by weight of electrically conductive metal or derivative thereof, based on total solids in the composition;
  ii) 0.5 to 15% by weight based on solids of a lead-tellurium-boron-oxide; and
  iii) an organic medium; and
(c) firing the semiconductor substrate, one or more insulating films, and thick-film paste, forming an electrode in contact with the one or more insulating layers and in electrical contact with the semiconductor substrate.

Such articles may be useful in the manufacture of photovoltaic devices. In one embodiment, the article is a semiconductor device comprising an electrode formed from the thick-film paste composition. In one embodiment, the electrode is a front-side electrode on a silicon solar cell. In one embodiment, the article further includes a back electrode.

EXAMPLES

Illustrative preparations and evaluations of thick-film paste compositions are described below.

Example I

Lead-Tellurium-Boron-Oxide Preparation

Lead-Tellurium-Boron-Oxide Preparation of Glasses 36-54, and 76 of Table 1, and the Glasses of Table 3

The lead-tellurium-boron-oxide (Pb—Te—B—O) compositions, glasses numbered 36-54, and 76 of Table 1 and glasses numbered 56-75 of Table 3 were prepared by mixing and blending $Pb_3O_4$, $TeO_2$, and $B_2O_3$ powders, and optionally, as shown in Table 1, $Li_2O$, $Bi_2O_3$, $TiO_2$, $Al_2O_3$, $PbF_2$, $SiO_2$, $BiF_3$, $SnO_2$, $ZnO$, $V_2O_5$, $Na_2O$, $CuO$, $ZrO_2$, $CeO_2$, and/or $Ag_2O$. The blended powder batch materials were loaded into a platinum alloy crucible and then inserted into a furnace at 900-1000° C. using an air- or $O_2$-containing atmosphere. The duration of the heat treatment was 20 minutes following the attainment of a full solution of the constituents. The resulting low viscosity liquid resulting from the fusion of the constituents was then quenched by metal roller. The quenched glass was then milled, and screened to provide a powder with a $D_{50}$ of 0.1 to 3.0 microns.

TABLE 1

Glass frit compositions in weight percent

Weight %

| Glass # | PbO | TeO2 | PbF2 | SiO2 | Bi2O3 | BiF3 | Li2O | SnO2 | Ag2O | ZnO | V2O5 | Al2O3 | B2O3 | Na2O | TiO2 | CuO | ZrO2 | CeO2 |
|---|---|---|---|---|---|---|---|---|---|---|---|---|---|---|---|---|---|---|
| 1 | 43.35 | 46.50 | | 6.86 | | | 0.44 | | | | | | 0.51 | | 2.35 | | | |
| 2 | 43.36 | 46.51 | | 7.07 | | | 0.45 | | | | | 1.55 | 1.06 | | | | | |
| 3 | 43.72 | 46.89 | | 6.91 | | | 0.44 | | | | | 1.51 | 0.52 | | | | | |
| 4 | 29.24 | 47.14 | 16.15 | 6.56 | | | 0.42 | | | | | | 0.49 | | | | | |

TABLE 1-continued

Glass frit compositions in weight percent

| Glass # | PbO | TeO2 | PbF2 | SiO2 | Bi2O3 | BiF3 | Li2O | SnO2 | Ag2O | ZnO | V2O5 | Al2O3 | B2O3 | Na2O | TiO2 | CuO | ZrO2 | CeO2 |
|---|---|---|---|---|---|---|---|---|---|---|---|---|---|---|---|---|---|---|
| 5 | 43.98 | 47.18 | | | 6.75 | | 0.43 | | | | | | 0.50 | | 1.16 | | | |
| 6 | 44.27 | 47.49 | | | 6.79 | | 0.43 | | | | | | 1.01 | | | | | |
| 7 | 44.47 | 47.74 | | | 6.83 | | 0.45 | | | | | | 0.50 | | | | | |
| 8 | 45.89 | 49.22 | | | 3.43 | | 0.44 | | | | | | 1.02 | | | | | |
| 9 | 46.18 | 49.54 | | | 3.35 | | 0.43 | | | | | | 0.50 | | | | | |
| 10 | 47.54 | 50.99 | | | | | 0.44 | | | | | | 1.03 | | | | | |
| 11 | 47.76 | 51.18 | | | | | | | | | | | 1.06 | | | | | |
| 12 | 47.14 | 50.57 | | | | | | | | | | | 2.28 | | | | | |
| 13 | 46.09 | 49.44 | | | | | | | | | | | 4.47 | | | | | |
| 14 | 51.43 | 36.78 | | | | 8.19 | 0.47 | | | | | | 3.13 | | | | | |
| 15 | 54.20 | 26.83 | | | | 14.91 | | | | | | | 4.07 | | | | | |
| 16 | 55.22 | 27.34 | | | 13.30 | | | | | | | | 4.14 | | | | | |
| 17 | 52.19 | 42.66 | | | | | 0.50 | | | | | | 4.66 | | | | | |
| 18 | 51.93 | 42.44 | | | | | 1.00 | | | | | | 4.63 | | | | | |
| 19 | 46.38 | 52.12 | | | | | 0.46 | | | | | | 1.04 | | | | | |
| 20 | 51.91 | 42.42 | | | | | | | | | | | 4.63 | 1.04 | | | | |
| 21 | 51.32 | 41.95 | | | | | | | | | | | 4.58 | 2.15 | | | | |
| 22 | 46.87 | 43.09 | | | 6.99 | | 0.47 | | | | | 1.53 | 1.05 | | | | | |
| 23 | 45.90 | 42.20 | | | | 9.38 | 0.59 | | | | | 0.89 | 1.04 | | | | | |
| 24 | 40.83 | 50.56 | 6.44 | | | | 0.52 | | | | | 0.61 | 1.04 | | | | | |
| 25 | 40.47 | 50.13 | 6.39 | | | | 0.52 | | | | | | 1.04 | | | | 1.45 | |
| 26 | 47.28 | 49.27 | | 0.40 | | | 0.45 | | | | | 0.31 | 1.05 | | 0.48 | | 0.75 | |
| 27 | 41.07 | 48.93 | 6.56 | 0.41 | | | 0.45 | | | | | 0.31 | 1.04 | | 0.48 | | 0.75 | |
| 28 | 47.50 | 48.51 | | | | | 0.46 | | | | | | 1.06 | | | 2.47 | | |
| 29 | 46.89 | 50.76 | | | | | 0.47 | | | | | 0.31 | 1.05 | | 0.52 | | | |
| 30 | 40.71 | 50.38 | 6.59 | | | | 0.46 | | | | | 0.30 | 1.04 | | 0.51 | | | |
| 31 | 83.50 | 4.98 | | 7.87 | | | 0.47 | | | | | 0.32 | 1.09 | | 1.00 | | 0.77 | |
| 32 | 46.89 | 50.32 | | | | | 0.46 | | | | | 1.25 | 1.07 | | | | | |
| 33 | 47.17 | 50.61 | | | | | | | | | | 1.19 | 1.02 | | | | | |
| 34 | 56.56 | 40.44 | | | | | 0.45 | | | | | 1.52 | 1.04 | | | | | |
| 35 | 56.89 | 40.67 | | | | | | | | | | 1.45 | 0.99 | | | | | |
| 36 | 48.16 | 51.65 | | | | | | | | | | | 0.19 | | | | | |
| 37 | 42.28 | 55.43 | | | | | 0.91 | | | | | | 0.21 | | 0.93 | | | 0.22 |
| 38 | 53.21 | 45.88 | | | | | 0.44 | | | | | | 0.48 | | | | | |
| 39 | 44.51 | 47.74 | | | 6.83 | | 0.44 | | | | | | 0.48 | | | | | |
| 40 | 44.31 | 50.17 | | | | | 0.46 | | 3.57 | | | | 0.52 | | 0.96 | | | |
| 41 | 42.92 | 54.44 | | | | | 0.78 | | | | | | 0.54 | | 1.31 | | | |
| 42 | 37.19 | 57.62 | | | | | 1.97 | | | | 0.63 | | 0.56 | | | | | 2.03 |
| 43 | 45.58 | 51.19 | | | | | 1.18 | | | | | | 0.60 | | 1.05 | | | 0.40 |
| 44 | 50.38 | 48.11 | | | | | 0.91 | | | | | | 0.60 | | | | | |
| 45 | 48.99 | 48.74 | | | | | 0.93 | | | | | | 0.61 | | 0.74 | | | |
| 46 | 45.73 | 50.02 | | | | | 0.42 | | | | | | 0.84 | 0.43 | 0.48 | | | 2.07 |
| 47 | 45.26 | 49.53 | | | | | 0.55 | | | 2.25 | | | 0.86 | | 0.49 | | | 1.06 |
| 48 | 64.85 | 25.88 | | 7.88 | | | 0.10 | | | | | 0.10 | 0.93 | 0.05 | | | 0.21 | |
| 49 | 47.25 | 49.69 | | | | | 0.84 | | | | | | 0.98 | | 1.24 | | | |
| 50 | 45.77 | 51.64 | | | | | 0.80 | | | | | | 1.09 | | 0.71 | | | |
| 51 | 47.24 | 50.67 | | | | | 1.00 | | | | | | 1.09 | | | | | |
| 52 | 44.08 | 39.96 | 12.96 | | | | 0.52 | | | | | 0.50 | 1.21 | | 0.78 | | | |
| 53 | 40.44 | 54.68 | | | | | 1.23 | | | | | | 1.38 | | | | | 2.27 |
| 54 | 66.47 | 11.13 | | 10.98 | | | 0.16 | 1.05 | 7.66 | | | 0.20 | 1.84 | 0.08 | | | 0.42 | |
| 55 | 60.36 | 32.38 | | 4.06 | | | 0.47 | | | | | 1.62 | 1.11 | | | | | |
| 76 | 47.80 | 51.27 | | | | | 0.45 | | | | | | 0.49 | | | | | |

Note:
the compositions in the table are displayed as weight percent, based on the weight of the total glass composition.

Lead-Tellurium-Boron-Oxide Preparation of Glasses 1-35, & 55, of Table 1 and Glasses 77-90 of Table 2

Mixtures of $TeO_2$ powder (99+% purity), PbO or $Pb_3O_4$ powder, and $B_2O_3$ powder (ACS reagent grade, 99+% purity) and optionally $Bi_2O_3$, $Li_2O$, $Li_2CO_3$, $Al_2O_3$, $TiO_2$, CuO, $ZrO_2$, $Na_2O$, $Na_2CO_3$, $BiF_3$, $SiO_2$, and/or $PbF_2$ were tumbled in a suitable container for 15 to 30 minutes to mix the starting powders. The starting powder mixture was placed in a platinum crucible and heated in air at a heating rate of 10° C./min to 900° C. and then held at 900° C. for one hour to melt the mixture. The melt was quenched from 900° C. by removing the platinum crucible from the furnace and pouring the melt onto a stainless steel platen. The resulting material was ground in a mortar and pestle to less than 100 mesh. The ground material was then ball-milled in a polyethylene container with zirconia balls and isopropyl alcohol until the $D_{50}$ was 0.5-0.7 microns. The ball-milled material was then separated from the milling balls, dried, and run through a 230 mesh screen to provide the powders used in the thick-film paste preparations.

TABLE 2

Glass frit compositions in weight percent

| Glass # | TeO2/PbO (mole ratio) | Weight % | | | | | | | | |
|---|---|---|---|---|---|---|---|---|---|---|
| | | PbO | TeO2 | PbF2 | Bi2O3 | Li2O | Al2O3 | B2O3 | TiO2 | CuO |
| 77 | 2.54 | 34.80 | 63.21 | | | 0.70 | | 0.54 | 0.75 | |
| 78 | 2.44 | 35.49 | 61.92 | | | 0.71 | | 1.11 | 0.76 | |
| 79 | 2.34 | 36.21 | 60.59 | | | 0.73 | | 1.69 | 0.78 | |
| 80 | 1.95 | 40.95 | 57.10 | | | 0.69 | | 0.53 | 0.73 | |
| 81 | 1.87 | 41.74 | 55.72 | | | 0.70 | | 1.09 | 0.75 | |
| 82 | 1.78 | 42.57 | 54.29 | | | 0.71 | | 1.66 | 0.76 | |
| 83 | 1.53 | 46.85 | 51.23 | | | 0.67 | | 0.52 | 0.72 | |
| 84 | 1.46 | 47.76 | 49.76 | | | 0.69 | | 1.07 | 0.73 | |
| 85 | 1.39 | 48.68 | 48.24 | | | 0.70 | | 1.63 | 0.75 | |
| 86 | 1.51 | 46.84 | 50.71 | | | 0.45 | | 1.04 | | 0.97 |
| 87 | 1.59 | 45.97 | 52.13 | | | 0.44 | | 0.52 | | 0.95 |
| 88 | 1.49 | 47.06 | 49.99 | | | 0.45 | | 1.05 | 0.48 | 0.97 |
| 89 | 1.50 | 43.36 | 46.51 | | 7.07 | 0.45 | 1.55 | 1.06 | | |
| 90 | 1.50 | 43.72 | 46.89 | | 6.91 | 0.44 | 1.51 | 0.52 | | |

Note:
the compositions in the table are displayed as weight percent, based on the weight of the total glass composition. The $TeO_2/PbO$ ratios are a molar ratio between only $TeO_2$ and PbO of the composition

TABLE 3

Glass frit compositions in weight percent

| Frit ID | SiO2 | PbO | B2O3 | Li2O | TiO2 | Ag2O | SnO2 | TeO2 |
|---|---|---|---|---|---|---|---|---|
| 56 | 8.40 | 60.90 | | 1.47 | 0.93 | | 0.70 | 27.60 |
| 57 | | 46.04 | | 0.40 | 4.18 | | | 49.38 |
| 58 | | 46.78 | | 0.83 | 2.22 | | | 50.17 |
| 59 | | 47.43 | | 0.85 | 0.84 | | | 50.88 |
| 60 | | 33.77 | | 2.39 | 2.13 | | | 61.71 |
| 61 | | 45.35 | | 0.48 | 0.43 | | | 53.74 |
| 62 | | 36.19 | | 1.99 | 1.77 | | | 60.05 |
| 63 | | 37.35 | | 2.39 | 2.13 | | | 58.13 |
| 64 | | 36.19 | | 1.82 | 3.06 | | | 58.94 |
| 65 | | 40.81 | | 2.39 | 2.13 | | | 54.67 |
| 66 | | 44.28 | | 0.16 | 0.42 | 12.29 | | 42.84 |
| 67 | | 40.81 | | 0.59 | 1.57 | 9.08 | | 47.95 |
| 68 | | 40.81 | | 1.90 | 1.12 | | | 56.16 |
| 69 | | 45.77 | 1.09 | 0.80 | 0.71 | | | 51.64 |
| 70 | | 41.20 | | 0.34 | 2.30 | | | 56.16 |
| 71 | | 44.31 | 0.52 | 0.46 | 0.96 | 3.57 | | 50.17 |
| 72 | | 42.92 | 0.54 | 0.78 | 1.31 | | | 54.44 |
| 73 | | 42.22 | | 0.91 | 1.53 | | | 55.35 |
| 74 | | 48.25 | | | | | | 51.75 |
| 75 | | 48.04 | | 0.42 | | | | 51.54 |

Note:
the compositions in the table are displayed as weight percent, based on the weight of the total glass composition.

Example II

Past Preparation

Paste Preparation for Tables 5, 6, and 7

Paste preparations, in general, were prepared using the following procedure: The appropriate amount of solvent, medium, and surfactant from Table 4 were weighed and mixed in a mixing can for 15 minutes.

TABLE 4

| Component | Wt. % |
|---|---|
| 2,2,4-trimethyl-1,3-pentanediol monoisobutyrate | 5.57 |
| Ethyl Cellulose (50-52% ethoxyl) | 0.14 |
| Ethyl Cellulose (48-50% ethoxyl) | 0.04 |
| N-tallow-1,3-diaminopropane dioleate | 1.00 |
| Hydrogenated castor oil | 0.50 |

TABLE 4-continued

| Component | Wt. % |
|---|---|
| Pentaerythritol tetraester of perhydroabietic acid | 1.25 |
| Dimethyl adipate | 3.15 |
| Dimethyl glutarate | 0.35 |

Since Ag is the major part of the solids, it was added incrementally to ensure better wetting. When well mixed, the paste was repeatedly passed through a 3-roll mill at progressively increasing pressures from 0 to 250 psi. The gap of the rolls was set to 2 mils. The paste viscosity was measured using a Brookfield viscometer and appropriate amounts of solvent and resin were added to adjust the paste viscosity toward a target of between 230 and 280 Pa-sec. The degree of dispersion was measured by fineness of grind (FOG). A typical FOG value for a paste is less than 20 microns for the fourth longest, continuous scratch and less than 10 microns for the point at which 50% of the paste is scratched.

To make the final pastes used to generate the data in Tables 5, 6, and 7, 2 wt % of a frit or frits from Table 1 was mixed into a portion of the Ag paste and dispersed by shear between rotating glass plates known to one skilled in the art as a muller.

The paste examples of Tables 5, 6, and 7 were made using the procedure described above for making the paste compositions listed in the table according to the following details.

Tested pastes contained 85 to 88% silver powder. The examples used a singular spherical silver with a $D_{50}$=2.0 µm.

The paste examples of Table 11 were made using by mixing one or two different frit powders as described in the table to appropriate amount of medium of Table 4 then roll milled with a 2 mil gap at progressively increasing pressure from 0 to over 250 psi to make a precursor paste. Then Ag powder was added incrementally and mixed into the precursor paste to ensure proper wetting of the Ag powder. The Ag powder was 85 to 88% of the paste composition. The paste with all the Ag powder added was again roll milled with a 2 mil gap at progressive pressure from 0 to 75 psi. Resin and solvent were added to adjust to the viscosity between 230 and 280 Pa-sec. This example used a singular spherical silver powder with a D50=2.0 um.

Thick-Film Paste Preparation of Examples in Tables 8, 9, and 10

The organic components (~4.6 g), as described in Table 4, were put into a Thinky mixing jar (Thinky USA, Inc.) and Thinky-mixed at 2000 RPM for 2 to 4 minutes until well blended. The inorganic components (Pb—Te—B—O powders and silver conductive powders) were tumble-mixed in a glass jar for 15 min. The total weight of the inorganic components was 44 g, of which 42.5-43.5 g was silver powder and 0.5-1.5 g was the mixture of PbO, $TeO_2$, and $B_2O_3$ powders. One third of inorganic components were then added to the Thinky jar containing the organic components and mixed for 1 minute at 2000 RPM. This was repeated until all of the inorganic components were added and mixed. The paste was cooled and the viscosity was adjusted to between 200 and 500 Pa·s by adding solvent and then mixing for 1 minute at 2000 RPM. This step was repeated until the desired viscosity was achieved. The paste was then roll-milled at a 1 mil gap for 3 passes at 0 psi and 3 passes at 75 psi. The degree of dispersion was measured by fineness of grind (FOG). The FOG value is typically equal to or less than 20/10 for thick-film pastes. The viscosity of the paste was adjusted after 24 hrs at room temperature to between 200 and 320 Pa·s. Viscosity was measured after 3 minutes at 10 RPM in a viscometer. The viscosity of each paste was measured on a Brookfield viscometer (Brookfield, Inc., Middleboro, Mass.) with a #14 spindle and a #6 cup.

Example III

Solar Cell Preparation

Solar Cell Preparation of the Examples in Tables 5, 6, and 7

For the examples in Tables 5, 6, and 7, multi-crystalline silicon wafers with a 65Ω/□ phosphorus-doped emitter layer were obtained from Gintech Energy Corporation (Taiwan) or DeutscheCell (Germany). 6 inch (152 mm) square wafers were cut down to 1.1 inch (28 mm) squares with a dicing saw.

The solar cells used were textured by isotropic acid etching and had an anti-reflection coating (ARC) of $SiN_X$:H. Efficiency and fill factor were measured for each sample. Each sample was made by screen-printing using an ETP model L555 printer set with a squeegee speed of 250 mm/sec. The screen used had a pattern of 11 finger lines with a 100 µm opening and 1 bus bar with a 1.5 mm opening on a 20 µm emulsion in a screen with 325 mesh and 23 µm wires. A commercially available Al paste, DuPont PV381, was printed on the non-illuminated (back) side of the device.

The device with the printed patterns on both sides was then dried for 10 minutes in a drying oven with a 250° C. peak temperature. The substrates were then fired sun-side up with a CF7214 Despatch 6-zone IR furnace using a 560 cm/min belt speed and the first five zones were set to 550-600-650-700-800 and the sixth zone was set to the temperatures indicated in Tables 5, 6, and 7. The actual temperature of the part was measured during processing. The estimated peak temperature of each part was 770-780° C. and each part was above 650° C. for a total time of 4 seconds. The fully processed samples were then tested for PV performance using a calibrated ST-1000 tester.

Efficiency and fill factor were measured for each sample, as shown in Tables 5, 6, and 7. For each paste, the mean and median values of the efficiency and fill factor for 6 to 10 samples are shown.

Solar Cell Preparation of the Examples of Tables 8, 9, and 10

Solar cells for testing the performance of the thick-film paste were made from 200 micron DeutscheCell multi-crystalline silicon wafers with a 65 ohm/sq. phosphorus-doped emitter layer which had an acid-etched textured surface and 70 nm thick PECVD $SiN_x$ anti-reflective coating. The wafers were cut into 28 mm×28 mm wafers using a diamond wafering saw. Wafers were screen-printed after being cut down using an AMI-Presco MSP-485 screen printer to provide a bus bar, eleven conductor lines at a 0.254 cm pitch, and a full ground-plane, screen-printed aluminum back-side conductor. After printing and drying, cells were fired in a BTU International rapid thermal processing belt furnace. The firing temperatures shown in Tables 8, 9, and 10 were the furnace setpoint temperatures of the final, peak zone, which were approximately 125° C. greater than the actual wafer temperature. The fired conductor line median line width was 120 microns and mean line height was 15 microns. The median line resistivity was $3.0 \times 10^{-6}$ ohm·cm. Performance of the 28 mm×28 mm cells is expected to be impacted by edge effects that reduce the overall solar cell fill factor (FF) by ~5%.

Solar Cell Preparation of the Examples of Table 11

Solar cells for testing the performance of the thick-film pastes of Table 11 were made from full 6"×6" (152 mm×152 mm) 65Ω/□ mono-crystalline cells that were alkaline textured supplied by Gintech Energy Corporation, Taiwan. A 65 line pattern of the pastes described in Table 6 were applied by screen printing to the front side of the cells using a screen with 80 µm openings in a 325 mesh, 23 µm wire diameter screen with a 25 µm emulsion. An aluminum back-side paste and a commercially available tabbing paste, DuPont PV505, were applied to the back side of the cells. Mean and median efficiency and fill factor were measured using I-V techniques and are shown in Table 11.

Example IV

Solar Cell Performance: Efficiency and Fill Factor

Solar Cell Performance: Efficiency and Fill Factor for Tables 5, 6, 7, and 11

The solar cells built according to the method described herein were tested for conversion efficiency. An exemplary method of testing efficiency is provided below.

In an embodiment, the solar cells built according to the method described herein were placed in a commercial I-V tester for measuring efficiencies (Telecom STV, model ST-1000). The Xe arc lamp in the I-V tester simulated the sunlight with a known intensity, AM 1.5, and irradiated the front surface of the cell. The tester used a multi-point contact method to measure current (I) and voltage (V) at approximately 400 load resistance settings to determine the cell's I-V curve. Both fill factor (FF) and efficiency (Eff) were calculated from the I-V curve.

Solar Cell Performance: Efficiency and Fill Factor for Tables 8, 9, and 10

Solar cell performance of the examples of Tables 8, 9, and 10 was measured using a ST-1000, Telecom STV Co. IV tester at 25° C.±1.0° C. The Xe arc lamp in the IV tester simulated sunlight with a known intensity, and irradiated the front surface of the cell. The tester used a four-contact method to measure current (I) and voltage (V) at approximately 400 load resistance settings to determine the cell's I-V curve. Solar cell efficiency (Eff), fill factor (FF), and series resistance (Rs) (data not shown for Rs) were calculated from the I-V curve. Ideality factor was determined using the Suns-VOC technique (Suns-VOC data not shown).

Median and mean values for efficiency and fill factor for these examples are shown in Tables 8, 9, and 10.

TABLE 5

Eff % and FF results of paste using select glass frits of Table 1

| | | | Efficiency Eff % | | | | | | Fill Factor FF | | | | | |
|---|---|---|---|---|---|---|---|---|---|---|---|---|---|---|
| | | Frit level | 905 C. | | 920 C. | | 940-945 C. | | 905 C. | | 920 C. | | 940-945 C. | |
| Example # | Glass # | (wt %) | Mean | Median | Mean | Median | Mean | Median | Mean | Median | Mean | Median | Mean | Median |
| 1 | 41 | 2 | 13.96 | 14.03 | | | 15.04 | 15.07 | 71.5 | 71.7 | | | 75.0 | 75.3 |
| 2 | 38 | 2 | 14.82 | 14.89 | | | 15.40 | 15.41 | 74.0 | 74.3 | | | 76.1 | 76.4 |
| 3 | 52 | 2 | 12.97 | 12.84 | | | 14.44 | 14.52 | 64.2 | 63.1 | | | 70.9 | 70.9 |
| 4 | 40 | 2 | 14.47 | 14.52 | | | 15.40 | 15.41 | 72.2 | 72.3 | | | 76.0 | 75.9 |
| 5 | 39 | 2 | | | 14.41 | 14.71 | 14.52 | 14.59 | | | 74.3 | 74.8 | 76.3 | 76.3 |
| 6 | 54 | 2 | | | 11.80 | 11.81 | 10.95 | 11.01 | | | 59.4 | 59.3 | 56.6 | 57.1 |
| 7 | 48 | 2 | 12.68 | 12.83 | | | 14.49 | 14.79 | 64.9 | 65.6 | | | 73.5 | 74.1 |
| 8 | 51 | 2 | 15.08 | 15.08 | | | 15.25 | 15.18 | 76.3 | 76.4 | | | 76.7 | 77.1 |
| 9 | 50 | 2 | 14.87 | 14.92 | | | 15.17 | 15.13 | 75.4 | 75.6 | | | 76.6 | 76.7 |

TABLE 6

Eff % results of paste using select glass frits

| | | | Efficiency (Eff %) | | | |
|---|---|---|---|---|---|---|
| Example | | Frit level | 905 C. | | 945 C. | |
| # | Glass # | (wt %) | Mean | Median | Mean | Median |
| 40 | 45 | 2 | 13.00 | 13.76 | 14.96 | 14.89 |
| 41 | 76 | 2 | 14.38 | 14.33 | 15.17 | 15.07 |
| 42 | 49 | 2 | 12.60 | 12.71 | 15.12 | 15.27 |
| 43 | 37 | 2 | 13.15 | 13.25 | 15.53 | 15.53 |
| 44 | 43 | 2 | 13.65 | 13.68 | 15.19 | 15.22 |

TABLE 7

Fill Factor results of paste using select glass frits

| | | | Fill Factor (FF) | | | |
|---|---|---|---|---|---|---|
| Example | | Frit level | 905 C. | | 945 C. | |
| # | Glass # | (wt %) | Mean | Median | Mean | Median |
| 40 | 76 | 2 | 71.93 | 72.28 | 75.78 | 75.93 |
| 41 | 43 | 2 | 68.10 | 69.63 | 76.39 | 76.47 |
| 42 | 45 | 2 | 66.10 | 69.77 | 75.70 | 75.93 |
| 43 | 49 | 2 | 63.83 | 66.23 | 75.86 | 76.38 |
| 44 | 37 | 2 | 66.01 | 65.93 | 76.57 | 76.80 |

TABLE 8

Eff % and FF results of paste using select glass frits of Table 1

| | | | Efficiency Eff % | | | | | | | | | |
|---|---|---|---|---|---|---|---|---|---|---|---|---|
| Example # | Glass # | Frit level (wt %) | 910 C. | | 920 C. | | 930 C. | | 940 C. | | 950 C. | |
| | | | Mean | Median | Mean | Median | Mean | Median | Mean | Median | Mean | Median |
| 10 | 11 | 2 | | | 13.45 | 15.13 | 15.05 | 15.06 | 15.41 | 15.42 | 15.25 | 15.25 |
| 11 | 13 | 2 | | | 8.48 | 8.75 | 9.91 | 10.11 | 9.41 | 9.26 | 8.57 | 8.66 |
| 12 | 14 | 2 | 14.61 | 14.54 | 12.98 | 13.79 | 14.14 | 14.09 | 14.23 | 14.36 | | |
| 13 | 16 | 2.5 | 10.17 | 10.28 | 10.73 | 10.81 | 12.45 | 12.67 | 10.93 | 12.06 | 11.62 | 11.11 |
| 14 | 19 | 2 | 15.00 | 14.93 | 15.16 | 15.26 | 15.12 | 15.20 | 15.59 | 15.66 | 15.28 | 15.10 |
| 15 | 23 | 2 | 15.18 | 15.28 | 15.16 | 15.20 | 14.98 | 15.23 | 15.07 | 15.21 | | |
| 16 | 28 | 2.5 | 14.81 | 14.73 | 14.77 | 14.73 | 14.92 | 15.05 | 15.09 | 15.14 | 13.93 | 13.68 |
| 17 | 29 | 2.5 | 14.82 | 14.75 | 15.02 | 14.94 | 14.69 | 14.93 | 14.19 | 14.55 | | |
| 18 | 30 | 2 | 14.01 | 14.27 | 13.92 | 13.89 | 13.71 | 13.68 | 14.10 | 13.97 | | |
| 19 | 10 | 2 | 15.10 | 15.10 | 15.50 | 15.40 | 15.00 | 15.10 | 15.30 | 15.40 | | |
| 20 | 7 | 2 | 15.19 | 15.30 | 15.31 | 15.30 | 15.30 | 15.20 | 15.50 | 15.50 | 15.50 | 15.40 |
| 21 | 7 | 2 | 15.30 | 15.50 | 15.60 | 15.40 | 15.40 | 15.40 | 15.70 | 15.70 | | |
| 22 | 6 | 2 | 15.30 | 15.50 | 15.80 | 15.80 | 15.60 | 15.60 | 15.50 | 15.50 | | |
| 23 | 5 | 2 | 15.40 | 15.50 | 15.60 | 15.70 | 15.80 | 15.80 | 15.60 | 15.70 | | |
| 24 | 1 | 2 | 15.30 | 15.30 | 15.50 | 15.40 | 15.30 | 15.40 | 15.40 | 15.50 | | |

| | Fill Factor FF | | | | | | | | | |
|---|---|---|---|---|---|---|---|---|---|---|
| Example # | 910 C. | | 920 C. | | 930 C. | | 940 C. | | 950 C. | |
| | Mean | Median | Mean | Median | Mean | Median | Mean | Median | Mean | Median |
| 10 | | | 69.82 | 77.00 | 77.92 | 78.40 | 78.84 | 78.80 | 78.56 | 78.60 |
| 11 | | | 46.34 | 47.70 | 51.26 | 52.70 | 49.28 | 49.70 | 45.16 | 45.90 |
| 12 | 76.28 | 76.20 | 72.40 | 73.50 | 73.70 | 75.20 | 74.84 | 75.00 | | |
| 13 | 52.90 | 53.40 | 62.30 | 58.60 | 64.10 | 64.60 | 60.22 | 61.70 | 60.02 | 59.80 |
| 14 | 77.84 | 78.00 | 79.12 | 79.10 | 79.24 | 79.10 | 79.50 | 79.60 | 79.50 | 79.50 |
| 15 | 78.22 | 78.00 | 78.08 | 77.90 | 76.68 | 77.30 | 77.52 | 78.60 | | |
| 16 | 77.84 | 77.90 | 77.82 | 77.70 | 78.04 | 78.20 | 77.90 | 78.60 | 74.64 | 74.60 |
| 17 | 76.64 | 76.70 | 77.80 | 77.60 | 75.24 | 76.20 | 72.50 | 74.30 | | |
| 18 | 71.40 | 71.60 | 71.38 | 72.60 | 70.12 | 70.50 | 71.92 | 71.30 | | |

TABLE 8-continued

Eff % and FF results of paste using select glass frits of Table 1

| | | | | | | | | | |
|---|---|---|---|---|---|---|---|---|---|
| 19 | 77.56 | 77.00 | 79.40 | 79.40 | 78.80 | 79.30 | 79.30 | 79.30 | |
| 20 | 79.00 | 79.20 | 78.90 | 78.60 | 78.70 | 78.70 | 79.00 | 79.00 | 79.20 | 79.30 |
| 21 | 79.70 | 78.40 | 79.50 | 79.50 | 78.10 | 78.20 | 79.20 | 79.10 | |
| 22 | 79.30 | 79.20 | 79.20 | 79.40 | 79.20 | 79.20 | 78.80 | 79.00 | |
| 23 | 78.50 | 78.60 | 78.50 | 78.50 | 79.00 | 79.00 | 79.00 | 79.00 | |
| 24 | 78.50 | 78.50 | 79.00 | 78.90 | 78.80 | 78.60 | 79.00 | 79.00 | |

TABLE 9

Eff % results of paste using select glass frits

| | | | 900 C. | | 910 C. | | 915 C. | | 920 C. | | 930 C. | | 940 C. | | 945 C. | |
|---|---|---|---|---|---|---|---|---|---|---|---|---|---|---|---|---|
| Example Number | Glass # | Glass amount (wt %) | Eff. (%) mean | Eff. (%) median | Eff. (%) mean | Eff. (%) median | Eff. (%) mean | Eff. (%) median | Eff. (%) mean | Eff. (%) median | Eff. (%) mean | Eff. (%) median | Eff. (%) mean | Eff. (%) median | Eff. (%) mean | Eff. (%) median |
| 29 | 89 | 2 | 14.93 | 14.97 | 15.14 | 15.24 | | | 15.04 | 15.02 | 15.00 | 15.07 | 15.31 | 15.31 | | |
| 30 | 90 | 2 | 14.85 | 14.87 | 15.00 | 15.16 | | | 15.01 | 14.99 | 15.24 | 15.26 | 15.12 | 15.14 | | |
| 31 | 77 | 1.93 | | | | | 16.81 | 16.76 | | | 16.99 | 16.91 | | | 17.39 | 17.46 |
| 32 | 78 | 1.93 | | | | | 15.77 | 15.73 | | | 16.46 | 16.37 | | | 16.55 | 16.56 |
| 33 | 79 | 1.93 | | | | | 14.99 | 15.51 | | | 16.09 | 16.05 | | | 16.68 | 16.69 |
| 34 | 80 | 1.93 | | | | | 17.11 | 17.19 | | | 17.48 | 17.58 | | | 17.59 | 17.57 |
| 35 | 81 | 1.93 | | | | | 15.91 | 16.10 | | | 16.55 | 16.60 | | | 16.26 | 16.34 |
| 36 | 82 | 1.93 | | | | | 15.68 | 16.10 | | | 15.96 | 15.83 | | | 16.34 | 16.45 |
| 37 | 83 | 1.93 | | | | | 17.38 | 17.40 | | | 17.59 | 17.60 | | | 17.69 | 17.75 |
| 38 | 84 | 1.93 | | | | | 17.23 | 17.25 | | | 17.32 | 17.35 | | | 17.38 | 17.41 |
| 39 | 85 | 1.93 | | | | | 16.79 | 16.76 | | | 17.01 | 17.07 | | | 16.87 | 16.89 |

TABLE 10

Fill factor results of paste using select glass frits

| | | | 900 C. | | 910 C. | | 915 C. | | 920 C. | | 930 C. | | 940 C. | | 945 C. | |
|---|---|---|---|---|---|---|---|---|---|---|---|---|---|---|---|---|
| Example Number | Glass # | Glass amount (wt %) | FF mean | FF median | FF mean | FF median | FF mean | FF median | FF mean | FF median | FF mean | FF median | FF mean | FF median | FF mean | FF median |
| 29 | 89 | 2 | 78.62 | 77.80 | 78.46 | 78.50 | | | 77.00 | 77.10 | 77.38 | 77.20 | 78.38 | 78.40 | | |
| 30 | 90 | 2 | 78.54 | 78.60 | 78.74 | 78.70 | | | 78.70 | 78.60 | 78.70 | 78.60 | 78.82 | 79.00 | | |
| 31 | 77 | 1.93 | | | | | 71.50 | 71.56 | | | 72.41 | 72.05 | | | 73.71 | 73.81 |
| 32 | 78 | 1.93 | | | | | 67.22 | 67.14 | | | 70.12 | 69.88 | | | 70.70 | 70.60 |
| 33 | 79 | 1.93 | | | | | 64.08 | 65.98 | | | 68.72 | 68.76 | | | 70.84 | 70.95 |
| 34 | 80 | 1.93 | | | | | 72.58 | 72.70 | | | 74.02 | 74.26 | | | 74.66 | 74.66 |
| 35 | 81 | 1.93 | | | | | 68.01 | 68.58 | | | 70.39 | 70.57 | | | 69.56 | 69.75 |
| 36 | 82 | 1.93 | | | | | 66.91 | 68.53 | | | 67.90 | 67.31 | | | 69.76 | 70.14 |
| 37 | 83 | 1.93 | | | | | 73.93 | 73.99 | | | 74.40 | 74.44 | | | 75.22 | 75.22 |
| 38 | 84 | 1.93 | | | | | 73.33 | 73.64 | | | 73.66 | 73.85 | | | 73.94 | 73.98 |
| 39 | 85 | 1.93 | | | | | 71.63 | 71.50 | | | 72.38 | 72.45 | | | 72.15 | 72.20 |

TABLE 11

Eff % and FF results of paste containing a mixture of the glass frits from Table 1 and Table 3

| | Glass A | | Glass B | | Efficiency Eff % | | | | Fill Factor FF | | | |
|---|---|---|---|---|---|---|---|---|---|---|---|---|
| Example # | Glass A # | Frit level (wt %) | Glass B # | Frit level (wt %) | 890 C. Mean | 905 C. Mean | 920 C. Mean | 935 C. Mean | 890 C. Mean | 905 C. Mean | 920 C. Mean | 935 C. Mean |
| 25 | 60 | 2 | | | 18.00 | 18.06 | 18.07 | 17.93 | 78.4 | 78.6 | 78.7 | 78.6 |
| 26 | 39 | 2 | | | 18.08 | 18.07 | 18.13 | 18.03 | 78.8 | 78.9 | 79.0 | 79.0 |
| 27 | 39 | 1.5 | 60 | 0.5 | 18.03 | 18.07 | 18.09 | 17.98 | 78.7 | 78.8 | 78.9 | 78.7 |
| 28 | 39 | 1 | 60 | 1 | 17.93 | 18.02 | 18.01 | 17.96 | 78.3 | 78.6 | 78.8 | 78.7 |

Comparative Example I

Bismuth-Tellurium-Boron-Oxide

Preparation of Bismuth-Tellurium-Boron-Oxide

A bismuth-tellurium-boron-oxide (Bi—Te—B—O) containing composition as shown in Table 12 was prepared using boron oxide ($B_2O_3$), zinc oxide (ZnO), titanium oxide ($TiO_2$), bismuth oxide ($Bi_2O_3$), tellurium oxide ($TeO_2$), lithium carbonate ($LiCO_3$), and lithium phosphate ($LiPO_4$) and by the procedure described above in Example I: Lead-tellurium-boron-oxide preparation of glasses 36-54, and 76 of Table 1, and the glasses of Table 3.

TABLE 12

| Bismuth-tellurium-boron-oxide composition in weight percent of the oxides | |
|---|---|
| | Glass A (wt %) |
| $B_2O_3$ | 2.09 |
| ZnO | 0.98 |
| $TiO_2$ | 0.48 |
| $Bi_2O_3$ | 26.64 |
| $TeO_2$ | 67.22 |
| $P_2O_5$ | 0.43 |
| $Li_2O$ | 2.16 |

Note:
the composition in the table are displayed as weight percent, based on the weight of the total glass composition Paste Preparation Pastes using glass A were made by the following procedure. A paste was made by mixing the appropriate amount of organic vehicle (Table 4) and Ag powder. The Ag paste was passed through a 3-roll mill at progressively increasing pressures from 0 to 75 psi. The Ag paste viscosity was measured using a Brookfield viscometer and appropriate amounts of solvent and resin were added to adjust the paste viscosity toward a target of between 230 and 280 Pa-sec. Another paste was made by mixing the appropriate amount of organic vehicle (Table 4) and glass powder A. The frit paste was passed through a 3-roll mill at progressively increasing pressures from 0 to 250 psi. The degree of dispersion of each paste was measured by fineness of grind (FOG). A typical FOG value for a paste is less than 20 microns for the fourth longest, continuous scratch and less than 10 microns for the point at which 50% of the paste is scratched.

Ag and frit pastes were mixed with a mixed together using a planetary centrifugal mixer (Thinky Corporation, Tokyo, Japan) to make the final paste recipes displayed in Table 13.

Solar Cell Preparation and Efficiency and Fill Factor Measurement

Pastes were applied to 1.1"×1.1" dicing-saw-cut multi-crystalline silicon solar cells with a phosphorus-doped emitter on a p-type base. The pastes were applied to a Deutsche-Cell (DeutscheCell, Germany) multi-crystalline wafer with a 62Ω/□ emitter. The solar cells used were textured by isotropic acid etching and had an anti-reflection coating (ARC) of $SiN_x$:H. Efficiency and fill factor, as shown in Table 13, were measured for each sample. Each sample was made by screen-printing using a ETP model L555 printer set with a squeegee speed of 200 mm/sec. The screen used had a pattern of 11 finger lines with a 100 μm opening and 1 bus bar with a 1.5 mm opening on a 20 μm emulsion in a screen with 325 mesh and 23 μm wires. A commercially available Al paste, DuPont PV381, was printed on the non-illuminated (back) side of the device.

The device with the printed patterns on both sides was then dried for 10 minutes in a drying oven with a 250° C. peak temperature. The substrates were then fired sun-side up with a CF7214 Despatch 6 zone IR furnace using a 560 cm/min belt speed and 500-550-610-700-800-HZ6 temperature set points, where HZ6=885, 900 & 915° C. The actual temperature of the part was measured during processing. The estimated peak temperature of each part was 745-775° C. and each part was above 650° C. for a total time of 4 seconds. The fully processed samples were then tested for PV performance using a calibrated ST-1000 tester.

Efficiency and fill factor, shown in Table 13, were measured for each sample. For each paste, the mean and median values of the efficiency and fill factor for 6 samples are shown.

TABLE 13

| | | | Comparative Example: Recipe and electrical performance for pastes containing the bismuth-tellurium-boron-oxide glass A of Table 12 | | | | | | | | | | | |
|---|---|---|---|---|---|---|---|---|---|---|---|---|---|---|
| | | | Efficiency (Eff %) | | | | | | Fill Factor (FF) | | | | | |
| Glass | Ag | Frit | 900 | | 915 | | 930 | | 900 | | 915 | | 930 | |
| # | wt % | wt % | Mean | Median | Mean | Median | Mean | Median | Mean | Median | Mean | Median | Mean | Median |
| A | 88.6 | 2.1 | 10.04 | 10.13 | 12.46 | 13.01 | 12.61 | 12.98 | 52.8 | 53.5 | 65.1 | 67.3 | 64.2 | 65.6 |
| A | 86.3 | 4.2 | 1.14 | 0.83 | 1.45 | 1.42 | 2.93 | 2.79 | 28.7 | 29.7 | 29.4 | 29.5 | 30.7 | 30.1 |

What is claimed is:

1. A thick-film paste composition for use in forming an electrical connection in a photovoltaic device comprising a semiconductor substrate having at least one insulating layer on a main surface thereof, the composition comprising:

a) 85 to 99.5% by weight of an electrically conductive metal or derivative thereof, based on total solids in the composition;

b) 0.5 to 15% by weight, based on total solids in the composition, of a lead-tellurium-boron-oxide, wherein the lead-tellurium-boron-oxide comprises 0.25 to 5 wt % $B_2O_3$; and c) an organic medium;

wherein the thick-film paste, when fired, is capable of penetrating the at least one insulating layer.

2. The thick-film paste of claim 1, wherein the electrically conductive metal comprises silver.

3. The thick-film paste of claim 1, wherein the mole ratio of lead to tellurium of the lead-tellurium-boron-oxide is between 5/95 and 95/5.

4. The thick-film paste of claim 1, wherein the lead-tellurium-boron-oxide comprises:
25-75 wt % PbO,
10-70 wt % $TeO_2$,
and 0-20.0 wt % of components selected from the group of $PbF_2$, $SiO_2$, $Bi_2O_3$, $BiF_3$, $Li_2O$, $SnO_2$, $AgO_2$, ZnO, $V_2O_5$, $Al_2O_3$, $Na_2O$, $TiO_2$, CuO, $ZrO_2$, and $CeO_2$.

5. The thick-film paste of claim 4, wherein the lead-tellurium-boron-oxide further comprises: 0.1-5 wt % $TiO_2$.

6. The thick-film paste of claim 5, wherein the organic medium further comprises one or more additives selected from the group consisting of solvents, stabilizers, surfactants, and thickeners.

7. The thick-film paste of claim 1, wherein the electrically conductive metal is 90-95 wt % of the solids.

8. The thick-film paste of claim 1, wherein the lead-tellurium-boron-oxide is at least partially crystalline.

9. The thick-film paste of claim 4, further comprising an additive selected from the group consisting of: $PbF_2$, $SiO_2$, $Na_2O$, $K_2O$, $Rb_2O$, $Cs_2O$, $Al_2O_3$, MgO, CaO, SrO, BaO, $V_2O_5$, $ZrO_2$, $MoO_3$, $Mn_2O_3$, $Ag_2O$, ZnO, $Ga_2O_3$, $GeO_2$, $In_2O_3$, $SnO_2$, $Sb_2O_3$, $Bi_2O_3$, $BiF_3$, $P_2O_5$, CuO, NiO, $Cr_2O_3$, $Fe_2O_3$, CoO, $Co_2O_3$, and $CeO_2$.

10. The thick film paste of claim 1, wherein the lead-tellurium-boron-oxide further comprises oxides of one or more elements selected from the group consisting of: Si, Na, K, Rb, Cs, Mg, Ca, Sr, Ba, V, Zr, Mo, Mn, Zn, B, P, Se, Sn, Ga, Ge, In, Sb, Bi, Ce, Cu, F, Ni, Cr, Fe, Co, and Ag.

11. A process comprising:
(a) providing a semiconductor substrate comprising one or more insulating films deposited onto at least one surface of the semiconductor substrate;
(b) applying a thick-film paste composition onto at least a portion of the insulating film to form a layered structure, wherein the thick-film paste composition comprises:
  i) 85 to 99.5% by weight of an electrically conductive metal or derivative thereof, based on total solids in the composition;
  ii) 0.5 to 15% by weight, based on total solids in the composition, of a lead-tellurium-boron-oxide, wherein the lead-tellurium-boron-oxide comprises 0.25 to 5 wt % $B_2O_3$; and
  iii) an organic medium; and
(c) firing the semiconductor substrate, insulating film, and thick-film paste, to form an electrode in contact with the insulating layer and in electrical contact with the semiconductor substrate.

12. The process of claim 11, wherein the thick-film paste composition is applied pattern-wise onto the insulating film.

13. The process of claim 11, wherein the firing is carried out in air or an oxygen-containing atmosphere.

14. The process of claim 11, wherein the thick-film paste composition further comprises: 0.5 to 15% by weight based on solids of a lead-tellurium-lithium-titanium-oxide.

15. An article comprising:
(a) a semiconductor substrate;
(b) an insulating layer on the semiconductor substrate; and
(c) an electrode in contact with the insulating layer and in electrical contact with the semiconductor substrate, the electrode comprising an electrically conductive metal and lead-tellurium-boron-oxide, wherein the lead-tellurium-boron-oxide comprises 0.25 to 5 wt % $B_2O_3$.

16. The article of claim 15, wherein the electrode further comprises lithium and titanium.

17. The article of claim 15, wherein the article is a semiconductor device.

18. The article of claim 17, wherein the semiconductor device is a solar cell.

19. The thick-film paste of claim 1, further comprising: 0.5-15% by weight based on solids of a lead-tellurium-lithium-titanium-oxide.

20. The thick-film paste of claim 19, wherein the lead-tellurium-lithium-titanium-oxide comprises:
25-80 wt % PbO,
10-65 wt % $TeO_2$,
0.1-5 wt % $Li_2O$, and
0.1-5 wt % $TiO_2$.

21. The thick-film paste of claim 1, wherein the lead-tellurium-boron-oxide comprises 0.4-5 wt % $B_2O_3$.

22. The thick-film paste of claim 1, wherein the lead-tellurium-boron-oxide comprises 0.4-2 wt % $B_2O_3$.

23. The process of claim 11, wherein the lead-tellurium-boron-oxide comprises 0.4-5 wt % $B_2O_3$.

24. The process of claim 11, wherein the lead-tellurium-boron-oxide comprises 0.4-2 wt % $B_2O_3$.

25. The article of claim 15, wherein the lead-tellurium-boron-oxide comprises 0.4-5 wt % $B_2O_3$.

26. The article of claim 15, wherein the lead-tellurium-boron-oxide comprises 0.4-2 wt % $B_2O_3$.

* * * * *